United States Patent
Chen et al.

(10) Patent No.: US 10,001,688 B2
(45) Date of Patent: Jun. 19, 2018

(54) DISPLAY AND PIXEL STRUCTURE THEREOF

(71) Applicant: AU OPTRONICS CORPORATION, Hsin-chu (TW)

(72) Inventors: Yung-Yi Chen, Hsin-chu (TW); Chia-Yang Cheng, Hsin-chu (TW); Kuan-Yu Chen, Hsin-chu (TW); Chun-Hsien Yeh, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days. days.

(21) Appl. No.: 15/405,834

(22) Filed: Jan. 13, 2017

(65) Prior Publication Data

US 2017/0261826 A1    Sep. 14, 2017

(30) Foreign Application Priority Data

Mar. 10, 2016  (TW) .................. 105107280

(51) Int. Cl.
*H01L 27/14* (2006.01)
*H01L 29/04* (2006.01)
(Continued)

(52) U.S. Cl.
CPC ...... *G02F 1/136286* (2013.01); *G02F 1/1368* (2013.01); *G02F 1/13624* (2013.01);
(Continued)

(58) Field of Classification Search
CPC ........... G02F 1/136286; G02F 1/13624; G02F 1/134309; G02F 2001/134345;
(Continued)

(56) References Cited

U.S. PATENT DOCUMENTS 7,808,494 B2    10/2010 Lee et al.
8,179,350 B2     5/2012 Park et al.
(Continued)

FOREIGN PATENT DOCUMENTS

TW         201037431 A1    10/2010
WO    WO-2015/184654 A1 * 12/2015  ........... G02F 1/1368

OTHER PUBLICATIONS

Office Action issued by (TIPO) Intellectual Property Office, Ministry of Economic Affairs, R.O.C. dated Oct. 4, 2016 for Application No. 105107280, Taiwan.

*Primary Examiner* — Duy T Nguyen
(74) *Attorney, Agent, or Firm* — Tim Tingkang Xia, Esq.; Locke Lord LLP

(57) ABSTRACT

A pixel structure including a first data line, a first sub-pixel, and a second sub-pixel is disclosed. The first sub-pixel includes a first transistor and a first pixel electrode. A first end and a second end of the first transistor are connected to a first data line and the first pixel electrode, respectively. A distance between the first end and the first data line is less than a first width of the first pixel electrode. The second sub-pixel includes a second transistor and a second pixel electrode. A first end and a second end of the second transistor are connected to the first data line and the second pixel electrode, respectively. The first sub-pixel is disposed between the second sub-pixel and the first data line, and a distance between the first end of the second transistor and the first data line is less than the first width.

18 Claims, 9 Drawing Sheets

(51) Int. Cl.
*H01L 29/15* (2006.01)
*G02F 1/1362* (2006.01)
*G02F 1/1368* (2006.01)
*G02F 1/1343* (2006.01)
*H01L 27/12* (2006.01)

(52) U.S. Cl.
CPC ...... *G02F 1/134309* (2013.01); *H01L 27/124* (2013.01); *G02F 2001/134345* (2013.01); *G02F 2201/123* (2013.01); *G02F 2201/52* (2013.01)

(58) Field of Classification Search
CPC ............. G02F 1/1368; G02F 2201/123; G02F 2201/52; H01L 27/124
USPC ............................................. 349/48; 257/72
See application file for complete search history.

(56) References Cited

U.S. PATENT DOCUMENTS

| | | | |
|---|---|---|---|
| 8,233,122 B2 | 7/2012 | Lee et al. | |
| 8,792,064 B2 | 7/2014 | Ting et al. | |
| 9,664,969 B2 * | 5/2017 | Du | G02F 1/136286 |
| 2007/0146278 A1 * | 6/2007 | Pan | G09G 3/3659 |
| | | | 345/92 |
| 2008/0024709 A1 | 1/2008 | Moon | |
| 2014/0252364 A1 | 9/2014 | Yoon et al. | |

* cited by examiner

DISPLAY AND PIXEL STRUCTURE THEREOF

CROSS-REFERENCE TO RELATED PATENT APPLICATION

This application claims the benefit of priority to Taiwan Patent Application No. 105107280, filed Mar. 10, 2016. The entire content of the above identified application is incorporated herein by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present disclosure relates to a display and a pixel structure, and in particular, to a half source driving (HSD) display and a pixel structure thereof.

BACKGROUND

Due to advantages such as high definition, being small-sized and light-weighted, and a wide application range, flat-panel displays, such as a liquid crystal display and a plasma display, are widely applied in consumer electronics such as mobile phones, laptops, desktop displays, and TV sets, and have gradually replaced the conventional cathode ray tube displays and become mainstream displays. One category of current pixel array structures of liquid crystal panels is referred to as half source driving (HSD) pixel structure. In a display using the HSD pixel structure, the number of scanning lines is doubled so that the number of data lines is reduced by half, and because the number of data lines is halved, the manufacturing costs of a source driver is also reduced accordingly. However, in the current half source driving (HSD) display, a wire length from the data line to the drain of each thin-film transistor is excessively long, causing the resistance-capacitance load between the source driver and the thin-film transistor to be excessively high. Hence the driving capacity of the source driver becomes insufficient, which further leads to mismatching between luminance of sub-pixels driven by different source drivers. As a result, the so-called "half-frame" phenomenon occurs on the display, making the image quality not as good as expected. The foregoing "half-frame" phenomenon refers to that when one liquid crystal display is driven by two source drivers, in the case where the two source drivers drive sub-pixels by using the same pixel data, the luminance of half sub-pixels driven by one of the source drivers may be higher than the luminance of half sub-pixels driven by the other source driver.

SUMMARY

One embodiment of the present disclosure provides a display. The foregoing display comprises a first sub-pixel, a first gate line, a data line, a second sub-pixel, and a second gate line. The first sub-pixel comprises a first pixel electrode and a first transistor. The second sub-pixel comprises a second pixel electrode and a second transistor. The first pixel electrode is formed on a substrate, and has a first width along a first direction. The first transistor is configured to drive the first pixel electrode, and comprises a first end, a second end, and a control end. The first gate line is disposed along the first direction, and is coupled to a gate of the first transistor. The data line is disposed along a second direction, where the second direction is not parallel to the first direction. The first end of the first transistor has a first conductor coupled to the data line. The first conductor has a first wiring length along the first direction, and the first wiring length of the first conductor is not greater than the first width of the first pixel electrode. The second end of the first transistor has a second conductor, configured to be connected to the first pixel electrode. The second pixel electrode is formed on the substrate, and has a second width along the first direction. The second transistor is configured to drive the second pixel electrode, and the second transistor comprises a first end, a second end, and a control end. The second gate line is disposed along the first direction, and is coupled to a gate of the second transistor. The first gate line is different from the second gate line. The first end of the second transistor has a third conductor coupled to the data line. The third conductor has a second wiring length along the first direction, and the second wiring length of the third conductor is not greater than the second width of the second pixel electrode. Moreover, the second end of the second transistor comprises a fourth conductor, configured to be connected to the second pixel electrode.

One embodiment of the present disclosure provides a pixel structure. The pixel structure comprises a first data line, a first sub-pixel, and a second sub-pixel. The first sub-pixel comprises a first transistor and a first pixel electrode. The first transistor has a first end and a second end, wherein the first end is connected to the first data line, the second end is connected to the first pixel electrode, the first pixel electrode has a first width, and a distance between the first end and the first data line is less than the first width. The second sub-pixel comprises a second transistor and a second pixel electrode, wherein the second transistor has a first end and a second end, the first end of the second transistor is connected to the first data line, the second end of the second transistor is electrically connected to the second pixel electrode, the second pixel electrode has a second width, wherein the first sub-pixel is disposed between the second sub-pixel and the first data line along a direction perpendicular to the first data line, and a distance between the first end of the second transistor and the first data line is less than the first width.

The present disclosure provides a pixel structure of a half source driving display, so that each sub-pixel senses approximately equal equivalent load from a data line, so as to improve display quality.

DETAILED DESCRIPTION

Figure 1:
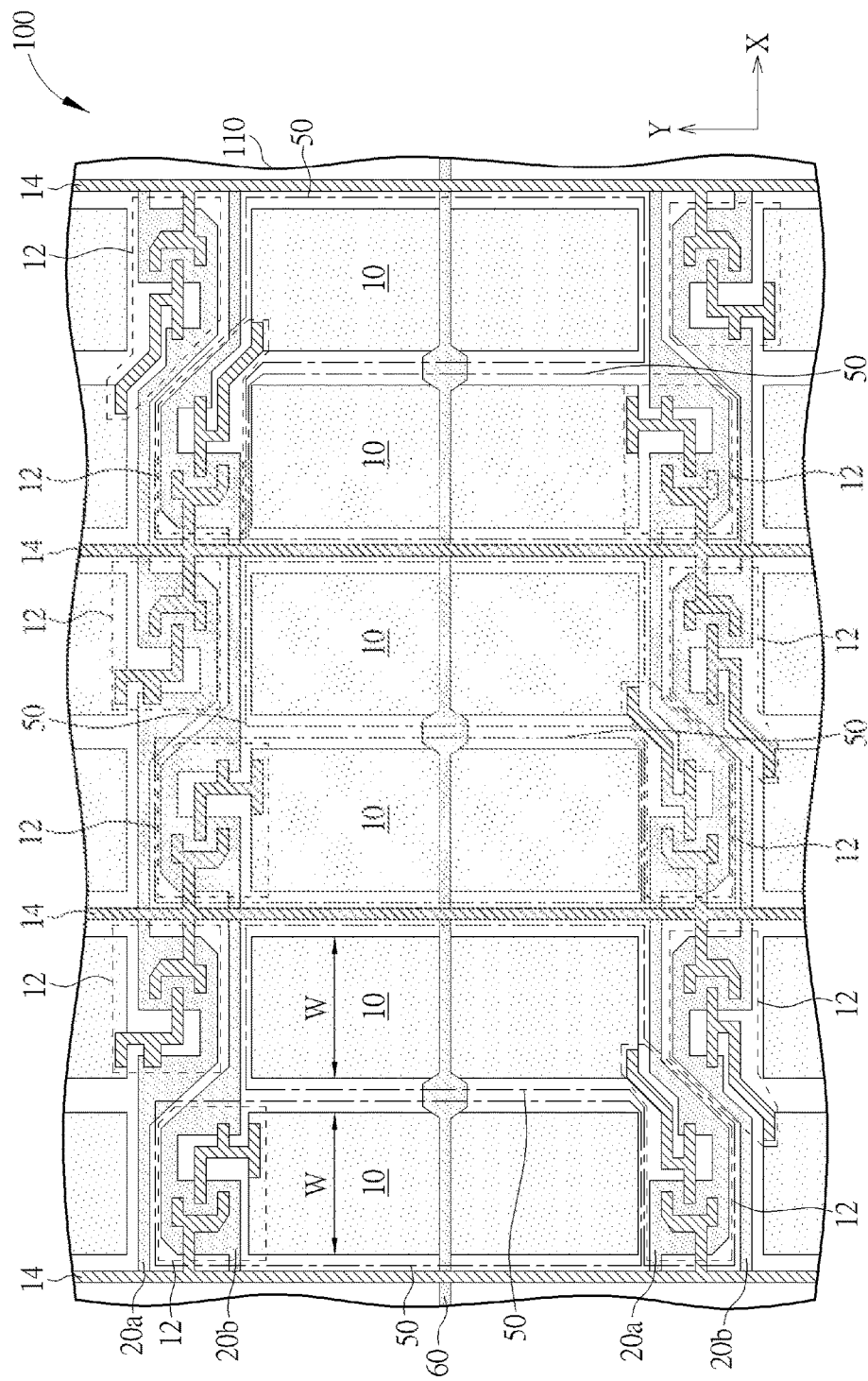
FIG. 1 and FIG. 2 are wiring diagrams of a display according to an embodiment of the present disclosure.

Please refer to FIG. 1. FIG. 1 is a wiring diagram of a display 100 according to an embodiment of the present disclosure. The display 100 comprises a substrate 110, multiple sub-pixels 50, a plurality of data lines 14, and a plurality of gate lines 20a and 20b. The sub-pixels 50 are formed on the substrate 110, and each sub-pixel 50 comprises a pixel electrode 10 and a transistor 12. The pixel electrodes 10 are formed on the substrate 110, and each transistor 12 is configured to drive a corresponding pixel electrode 10. In this embodiment, the display 100 is a half source driving (HSD) display, wherein the number of gate lines is doubled so that the number of data lines is reduced by half, and because the number of data lines is halved, a source driver does not require too many pins, and thus reducing costs. In an embodiment of the present disclosure, the display 100 may further comprise a common electrode 60. The common electrode 60 is configured to provide a common voltage to the foregoing pixel electrodes 10. Said pixel electrodes 10 may be pixel electrodes having multiple slits (not shown). The figure only schematically shows an arrangement area of the pixel electrodes 10, which may also be referred to as an area of a display region where the light can pass through. The pixel electrodes 10 may be designed differently according to different application fields, which is not limited to the present disclosure.

Figure 2:
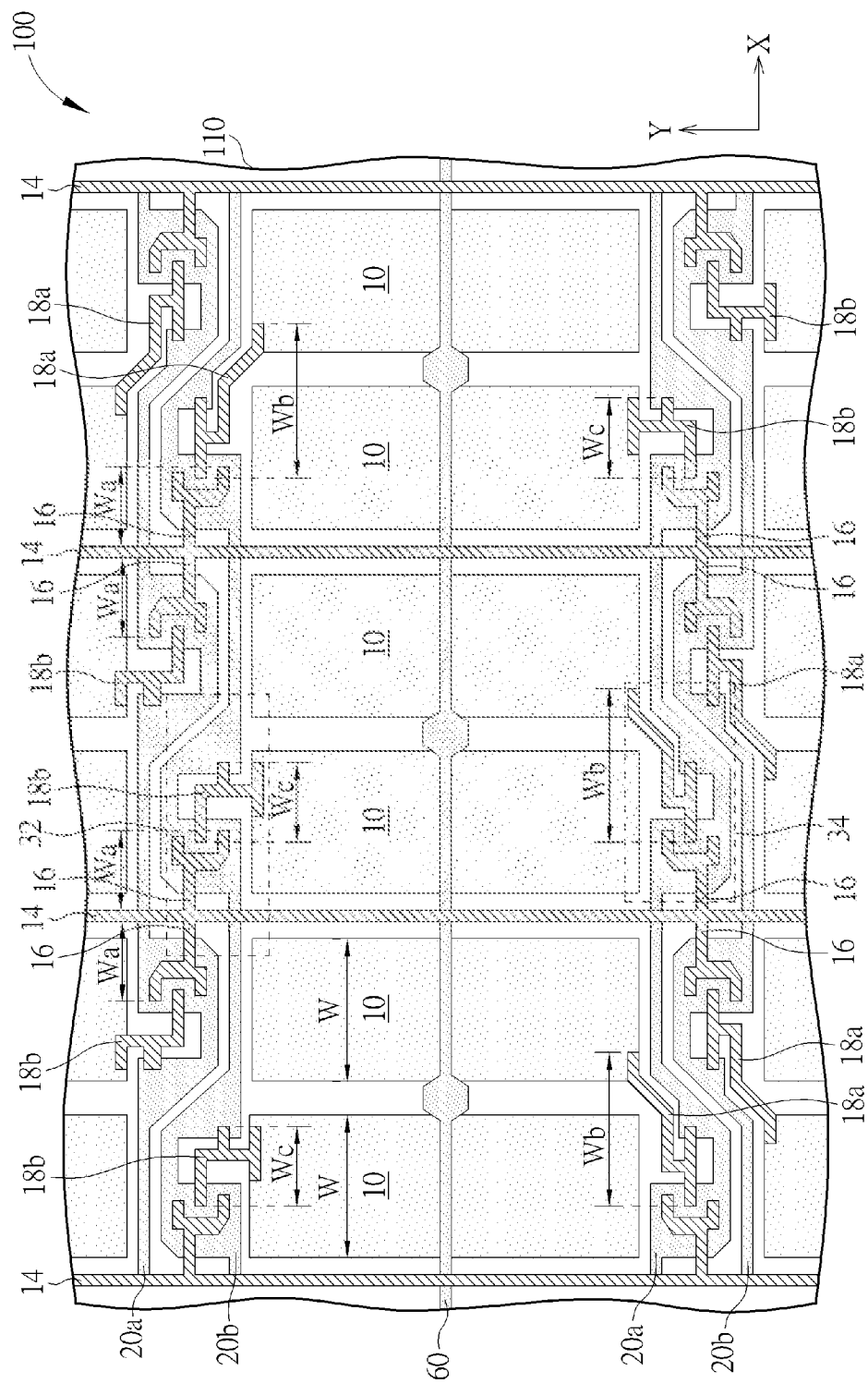
Figure 3:
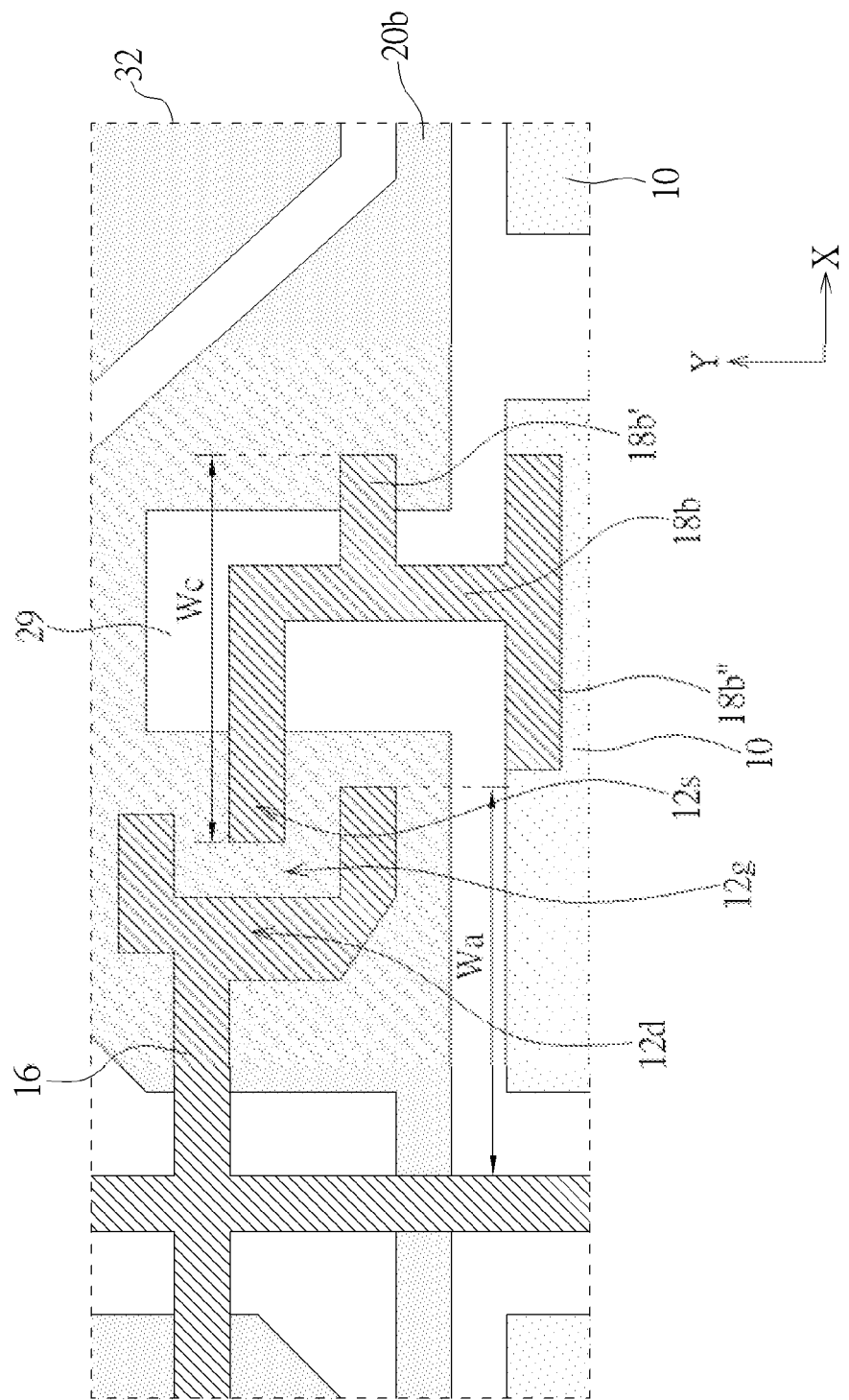
FIG. 3 and FIG. 4 are partial enlarged diagrams of the wiring diagram of the display in FIG. 1.
Figure 4:
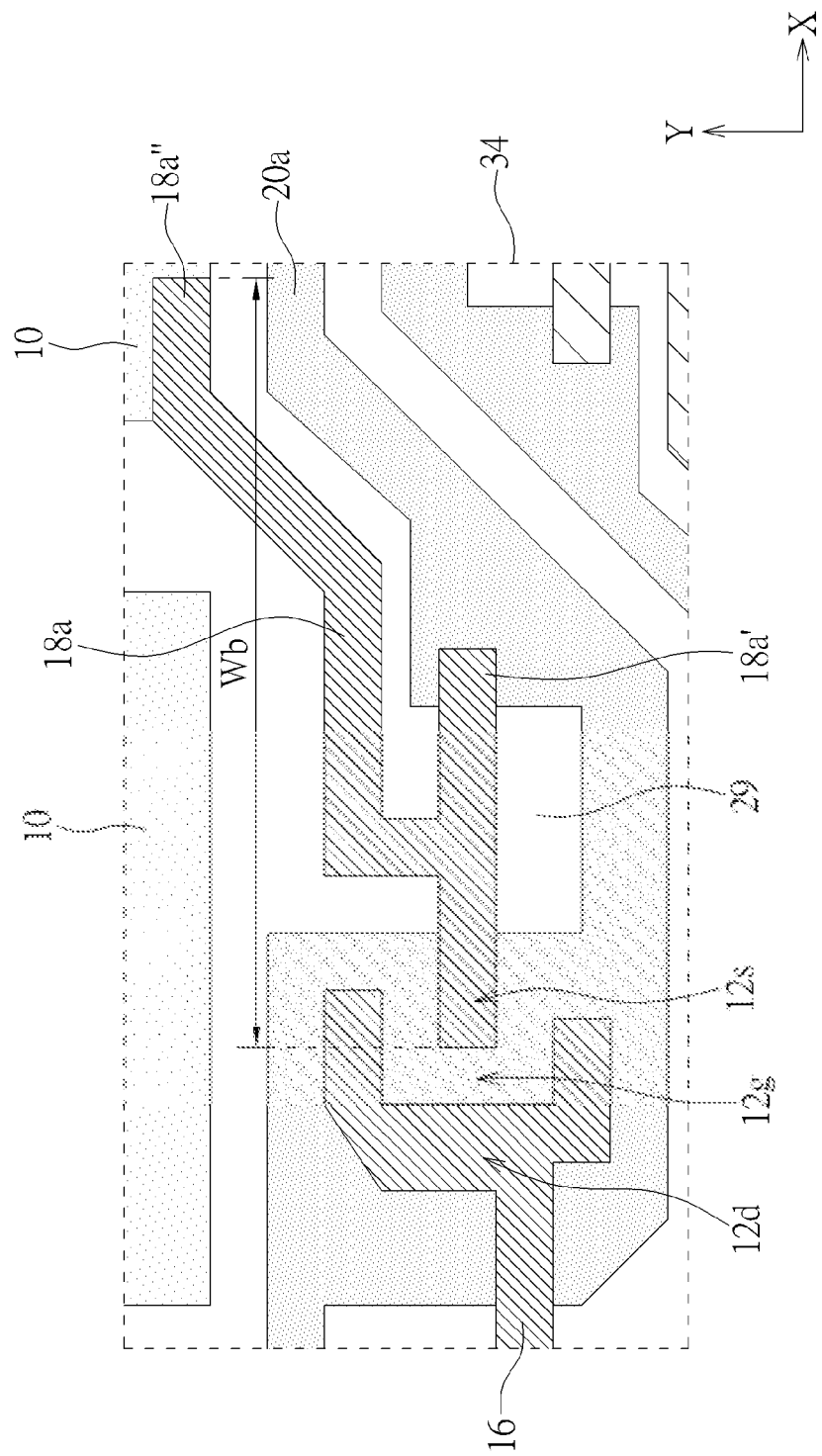

Please refer to FIG. 2 to FIG. 4. FIG. 2 is also a wiring diagram of the display 100 in FIG. 1. FIG. 3 is a partial enlarged view of the wiring diagram of the display in FIG. 2 at the area 32. FIG. 4 is a partial enlarged view of the wiring diagram of the display in FIG. 2 at the area 34. Wiring of the display 100 illustrated in FIG. 2 is identical to that of FIG. 1. However, to avoid the confusion of looking at a figure with too many reference numerals, multiple numerals corresponding to the elements and structures of the display 100 are separately illustrated in FIG. 1 and FIG. 2, so that viewers easily understand the relationship among and relative positions of the elements and structures of the display 100. The transistor 12 has a first end 12d, a second end 12s, and a control end 12g, where the control end 12g is coupled to a gate line 20a or 20b, and is configured to control the conduction of the transistor 12 according to a voltage provided by the gate line 20a or 20b. When the transistor 12 is conductive, an electrical connection between the first end 12d and the second end 12s is established; in contrast, when the transistor 12 is not conductive, the electrical connection between the first end 12d and the second end 12s is cut off. In addition, the first end 12d is connected to the data line 14, and the second end 12s is connected to the pixel electrode 10. In an embodiment of the present disclosure, the first end 12d may be a drain, the second end 12s may be a source, and the control end 12g may be a gate, which, however, is not limited thereto. In another embodiment of the present disclosure, the control end 12g is still a gate, but the first end 12d may also be a source, and the second end 12s may be a drain. It should be noted that the drain and the source of the transistor are not intended to limit the protection scope of the present disclosure. Generally, the control end 12g of the transistor 12 may be connected to the gate line 20a so as to receive a gate driving voltage; the first end 12d of the transistor 12 may be connected to the data line 14 so as to receive a data voltage from the data line 14; the second end 12s of the transistor 12 may be connected to the pixel electrode 10 so as to output the data voltage to the pixel electrode 10 when the transistor 12 is conductive.

Each transistor 12 comprises a first end 12d, a second end 12s, and a control end 12g. Each first end 12d comprises a conductor 16, and each second end 12s comprises a conductor 18a or 18b. The conductors 16 are configured to be coupled to corresponding data lines 14, and the conductors 18a and 18b are configured to be coupled to corresponding pixel electrodes 10. Along an X-direction, the pixel electrodes 10 have a width W, the conductors 16 have a wiring length Wa, the conductors 18a have a wiring length Wb, and the conductors 18b have a wiring length Wc. The wiring length Wa is less than the width W, the wiring length Wb is greater than width W, and the wiring length Wc is not greater than the width W. The gate lines 20a and 20b are coupled to the control end 12g of the transistor 12. When the gate driving voltage is provided to the gate line 20a or 20b, the transistor 12 coupled thereto becomes conductive. When the transistor 12 is conductive, the display 100 can provide the data voltage to the pixel electrodes 10 through the data lines 14, the conductors 16, and the corresponding conductors 18a or 18b, so as to update the gray scale of the sub-pixels 50 where the pixel electrodes 10 are located. The wiring length Wa of said conductors 16 is the length of the conductors 16 of each transistor 12 extending from the data lines 14 to the control end 12g of the transistor 12; the wiring length Wb or Wc of the conductors 18a or 18 is a length of the conductor 18a or 18b of each transistor 12 extending from the control end 12g of the transistor 12 to the pixel electrode 10.

In an embodiment of the present disclosure, in order for the equivalent load between each sub-pixel and data line to be generally similar or equal, wiring lengths from the first ends 12d of the transistors 12 of the sub-pixels 50 to the data lines 14 in the display 100 may be designed, so that the wiring lengths Wa of the conductors 16 are generally less than the widths W of the pixel electrodes 10. By means of the foregoing way of wiring, the wiring length Wa of the conductor 16 is not greater than the width W of the pixel electrode 10, so that the equivalent load or the equivalent impedance between the first ends 12d of the transistors 12 of the sub-pixels 50 and the data line 14 is generally equal, thereby avoiding, for example, problems of half source driving displays having poor display quality caused by inconsistent equivalent resistance-capacitance load of data lines 14 due to the wiring lengths Wa of the conductors 16 of the pixels being different, and thus avoid a display defect in a display.

Figure 5:
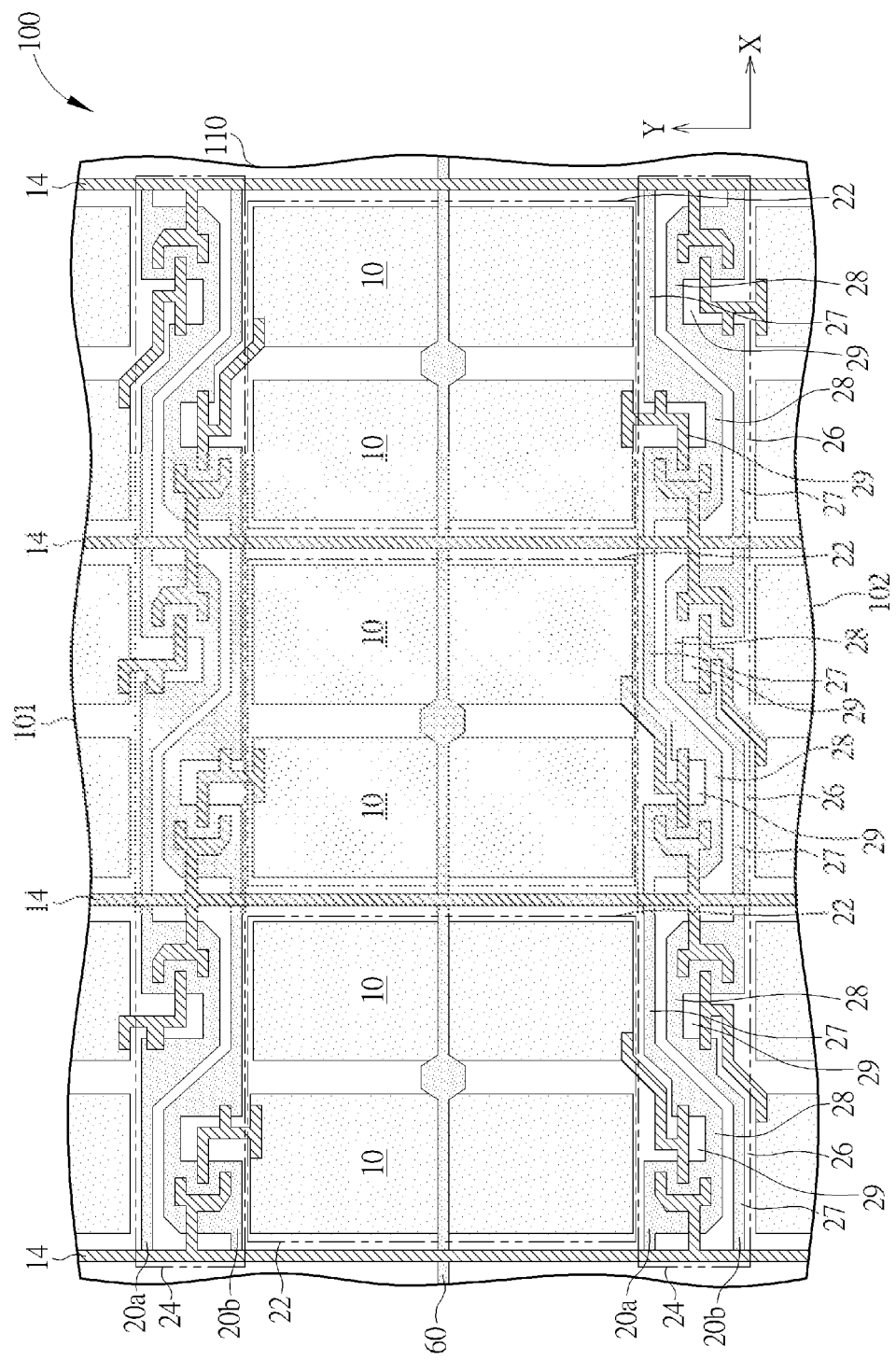
FIG. 5 is a wiring diagram of the display in FIG. 1.

Please refer to FIG. 5. FIG. 5 is also a wiring diagram of the display 100 in FIG. 1. Wiring of the display 100 illustrated in FIG. 5 is identical to those of FIG. 1 and FIG. 2. However, similarly, to avoid the confusion of looking at a figure with too many reference numerals, multiple numerals corresponding to the elements and structures of the display 100 are separately illustrated in FIG. 1, FIG. 2, and FIG. 5, so that viewers easily understand the relationship among and relative positions of the elements and structures of the display 100. As shown in FIG. 5, the substrate 110 comprises a plurality of pixel electrode regions 22 and a plurality of gate line regions 24 that are arranged in a staggered manner thereon. The gate lines 20a and 20b are disposed in the gate line region 24; each pixel electrode region 22 is located between two adjacent data lines 14 and two adjacent gate line regions 24; and in each pixel electrode region 22, a first column and a second column that are disposed in parallel in the X-direction each have a pixel electrode 10. In other words, a region formed by any two adjacent data lines 14 and two adjacent gate lines 20 comprises two sub-pixels 50 disposed in parallel in the X-direction. As shown in FIG. 5, one gate line 20a and one gate line 20b are disposed in each gate line region 24, to separately provide gate driving voltages to sub-pixels 50 on two sides of the gate line region 24. A sub-pixel 50 connected to the gate line 20a and a sub-pixel 50 connected to the gate line 20b of a gate line region 24 are separately located at the first column and second column of the pixel electrode regions 22 on two sides of the gate line region 24, and separately receive data voltages from different data lines 14.

In addition, each gate line region 24 may further have multiple sub-regions 26, and each sub-region 26 is located between two adjacent data lines 14. Each gate line 20a or 20b has a straight line structure 27 and an U-shaped structure 28 in a same sub-region 26. The U-shaped structure 28 has an opening 29, openings 29 of all U-shaped structures 28 included in each gate line 20a face towards a lateral side 101 of the display 100, openings 29 of all U-shaped structures 28 comprised in each gate line 20b face towards another lateral side 102 of the display 100, and the lateral side 101 is opposite to the lateral side 102. In other words, the opening 29 of each U-shaped structure 28 faces towards a sub-pixel 50 coupled to the U-shaped structure 28. Further, the X-direction is a direction perpendicular to the data line 14, and the data line 14 extends in a direction parallel to the Y-direction, wherein the Y-direction and the X-direction are not parallel. In another embodiment of the present disclosure, the Y-direction and the X-direction are perpendicular to each other. As shown in FIG. 5, in a same sub-region 26, straight line structures 27 of gate lines 20a do not overlap straight line structures 27 of gate lines 20b at all, that is, the gate lines 20a and the gate lines 20b drive sub-pixels independently. Moreover, the U-shaped structures 28 of the gate lines 20a and the U-shaped structures 28 of the gate lines 20b are disposed in a staggered manner in the X-direction, and in the case where two gate lines 20a and 20b are disposed in one single gate line region 24, a wiring area on the substrate 110 is effectively utilized by means of such layout design, so that the width of the gate line region 24 is not excessively large, and therefore, the aperture ratio of the sub-pixel 50 can be relatively enhanced.

Figure 6:
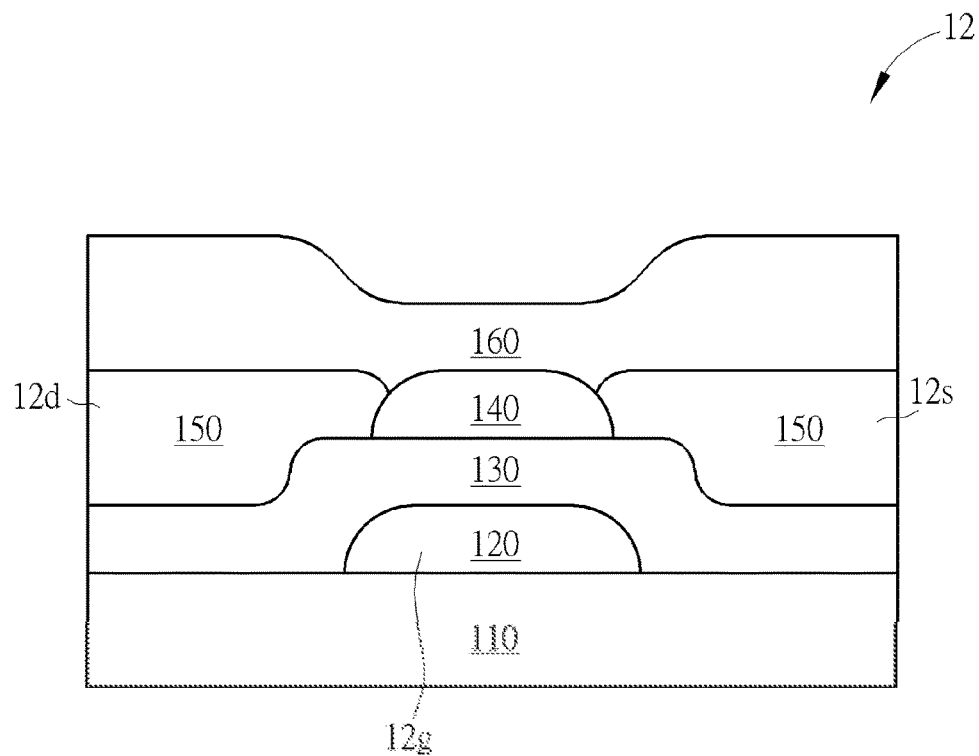
FIG. 6 is a sectional view of a transistor used in the display in FIG. 1 according to an embodiment of the present disclosure.

Please refer to FIG. 6. FIG. 6 is a sectional view of a transistor 12 used in the display 100 in FIG. 1 according to an embodiment of the present disclosure. In this embodiment, the transistor 12 is a pixel transistor used in a TN mode display panel. A first metal layer 120 is formed on the substrate 110, and the control end 12g of the transistor 12 and the gate lines 20a and 20b are all formed at the first metal layer 120. A SiNx layer 130 is formed on the first metal layer 120, and an n+ diffusion region 140 and a second metal layer 150 are formed at the SiNx layer 130, wherein the second end 12s and the first end 12d of the transistor 12 are formed at the second metal layer 150. In other words, the conductor 16 of the first end 12d and the conductors 18a and 18b of the second end 12s are all formed at the second metal layer 150. Another ITO layer 160 is formed in the n+ diffusion region 140 and on the second metal layer 150.

Figure 7:
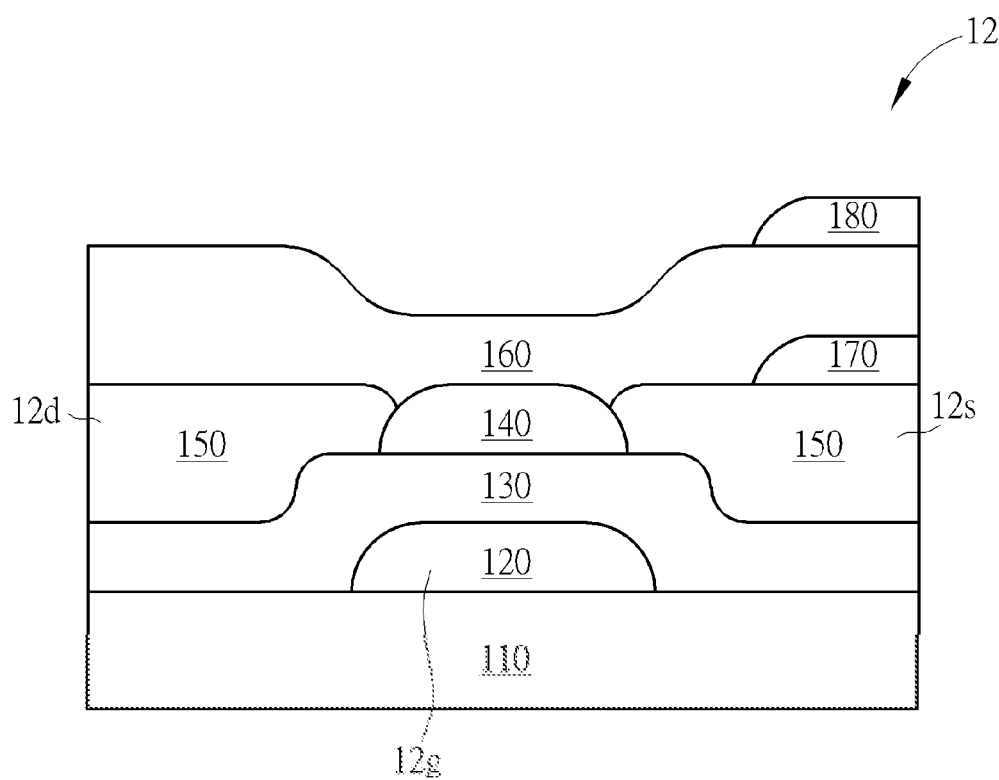
FIG. 7 is a sectional view of a transistor used in the display in FIG. 1 according to another embodiment of the present disclosure.

Please refer to FIG. 7. FIG. 7 is a sectional view of a transistor 12 used in the display 100 according to another embodiment of the present disclosure. In this embodiment, the transistor 12 is a pixel transistor used in an Advanced Hyper-Viewing Angle (AHVA) or a Fringe Field Switching (FFS) type display panel. A first metal layer 120 is formed on the substrate 110, and the control end 12g of the transistor 12 and the gate lines 20a and 20b are all formed at the first metal layer 120. A SiNx layer 130 is formed on the first metal layer 120, and an n+ diffusion region 140 and a second metal layer 150 are formed on the SiNx layer 130, wherein the second end 12s and the first end 12d of the transistor 12 are formed at the second metal layer 150. In other words, the conductor 16 of the first end 12d and the conductors 18a and 18b of the second end 12s are all formed at the second metal layer 150. Another SiNx layer 160 is formed in the n+ diffusion region 140 and at the second metal layer 150. A transparent electrode layer 170 is formed between the second metal layer 150 and the SiNx layer 160, so as to form the pixel electrode 10 of the sub-pixel 50. In addition, another transparent electrode layer 180 is formed above the SiNx layer 160, so as to form a common electrode. The transparent electrode layers 170 and 180 may be an indium tin oxide (ITO) layer.

Please refer to FIG. 2 again. The second end 12s of the transistor 12 may comprise a first group having the conductor 18a, and a second group having the conductor 18b. The wiring length Wb of each conductor 18a is greater than the width W of the pixel electrode 10, and the wiring length of each conductor 18b is not greater than the width W of the pixel electrode 10. Please refer to FIG. 3 and FIG. 4, the conductor 18a of the first group may comprise a primary branch 18a", wherein one end of the primary branch 18a" extends to the control end 12g where the gate line 20 connects to the transistor 12, and the other end of the primary branch 18a" extends to the pixel electrode 10. The conductor 18b of the second group may comprise a primary branch 18b", wherein one end of the primary branch 18b" extends to the control end 12g where the gate line 20 connects to the transistor 12, and the other end of the primary branch 18b" extends to the pixel electrode 10. The transistor 12 provides a data voltage to the pixel electrode 10 through the conductors 18a and 18b.

In an embodiment of the present disclosure, the conductor 18a of the first group may further comprise a secondary branch 18a', wherein one end of the secondary branch 18a' is connected to the primary branch 18a", and the other end of the secondary branch 18a' extends to the gate line 20a or 20b. The conductor 18b of the first group may further comprise a secondary branch 18b', wherein one end of the secondary branch 18b' is connected to the primary branch 18b", and the other end of the secondary branch 18b' extends to the gate line 20a or 20b. One end of the primary branch 18a" of the first group overlaps the gate line 20; one end of the secondary branch 18a' of the first group overlaps the gate line 20; the second metal layer 150 forming the primary branch 18a" and the first metal layer 120 forming the gate line 20 form a coupling capacitance, and the second metal layer 150 forming the secondary branch 18a' and the first metal layer 120 forming the gate line 20 also form a coupling capacitance. The coupling capacitance formed by means of overlapping the secondary branch 18a' and the gate line 20 can compensate for a mis-alignment causing by the coupling capacitance formed by means of overlapping the primary branch 18a" and the gate line 20, so that the equivalent coupling capacitance of each sub-pixel 50 is generally equal. One end of the primary branch 18b" of the second group overlaps the gate line 20; one end of the secondary branch 18b' overlaps the gate line 20; the second metal layer 150 forming the primary branch 18b" and the first metal layer 120 forming the gate line 20 form a coupling capacitance, and the second metal layer 150 forming the secondary branch 18b' and the first metal layer 120 forming the gate line 20 also form a coupling capacitance. The coupling capacitance formed by means of overlapping the secondary branch 18b' and the gate line 20 can compensate for a change, which is caused by mis-alignment, in the coupling capacitance formed by means of overlapping the primary branch 18b" and the gate line 20, so that the equivalent coupling capacitance of each sub-pixel 50 is generally equal.

In an embodiment of the present disclosure, the overlapping area of one end of the secondary branch 18b' of the second group and the gate line 20 is M times bigger than the overlapping area of one end of the secondary branch 18a' of the first group and the gate line 20, and the overlapping area of the secondary branch 18b' and the gate line 20 has to be greater than the overlapping area of the secondary branch 18a' and the gate line 20, wherein the area ratio may be designed to be 2≤M≤4 and may be designed according to the actual equivalent coupling capacitance of the transistor. In other words, the actual equivalent coupling capacitance of the secondary branch 18a' of the first group and the secondary branch 18b' of the second group could be substantially the same. By means of the area design of the secondary branch 18a' and the secondary branch 18b', in the case where the first end 12d and the second end 12s are the drain and source of the transistor 12, respectively, a difference between gate-source capacitance values of transistors 12 caused by the wiring lengths Wb and Wc of the conductor 18a and the conductor 18b described above can be thus reduced. And when the difference between gate-source capacitance values is reduced, capabilities of the source driver driving the sub-pixels 50 also become consistent, which helps improve the image quality of the display 100. Similarly, in the case where the first end 12d and the second end 12s are the source and drain of the transistor 12, respectively, by means of the area design of the secondary branch 18a' and the secondary branch 18b', a difference between gate-drain capacitance values of transistors 12 caused by the wiring lengths Wb and Wc of the conductor 18a and the conductor 18b described above can be thus reduced. And when the difference between gate-drain capacitance values is reduced, capabilities of the source driver driving the sub-pixels 50 also become consistent, which helps improve the image quality of the display 100.

Apart from the foregoing way of making the area of the secondary branch 18b' greater than the area of the secondary branch 18a', the difference between gate-source capacitance values or gate-drain capacitance values caused by the wiring lengths Wb and Wc of the conductor 18a and the conductor 18b can also be reduced by adjusting overlapping areas of the conductor 18a and the conductor 18b and the corresponding pixel electrodes 10. Please refer to FIG. 3 and FIG. 4, the overlapping portion of the conductor 18b and the corresponding pixel electrode 10 is the primary branch 18b", and the overlapping area of the conductor 18a and the corresponding pixel electrode 10 is the primary branch 18a", wherein the area of the primary branch 18b" is greater than the area of the primary branch 18a". By means of the area design of the primary branch 18a" and the primary branch 18b" described above, the problem of unequal equivalent coupling capacitance of transistors caused by mis-alignment during manufacture procedures can be alleviated, and the difference between gate-drain capacitance values or gate-source capacitance values caused by the wiring lengths Wb and Wc of the conductor 18a and the conductor 18b can also be reduced.

Figure 8:
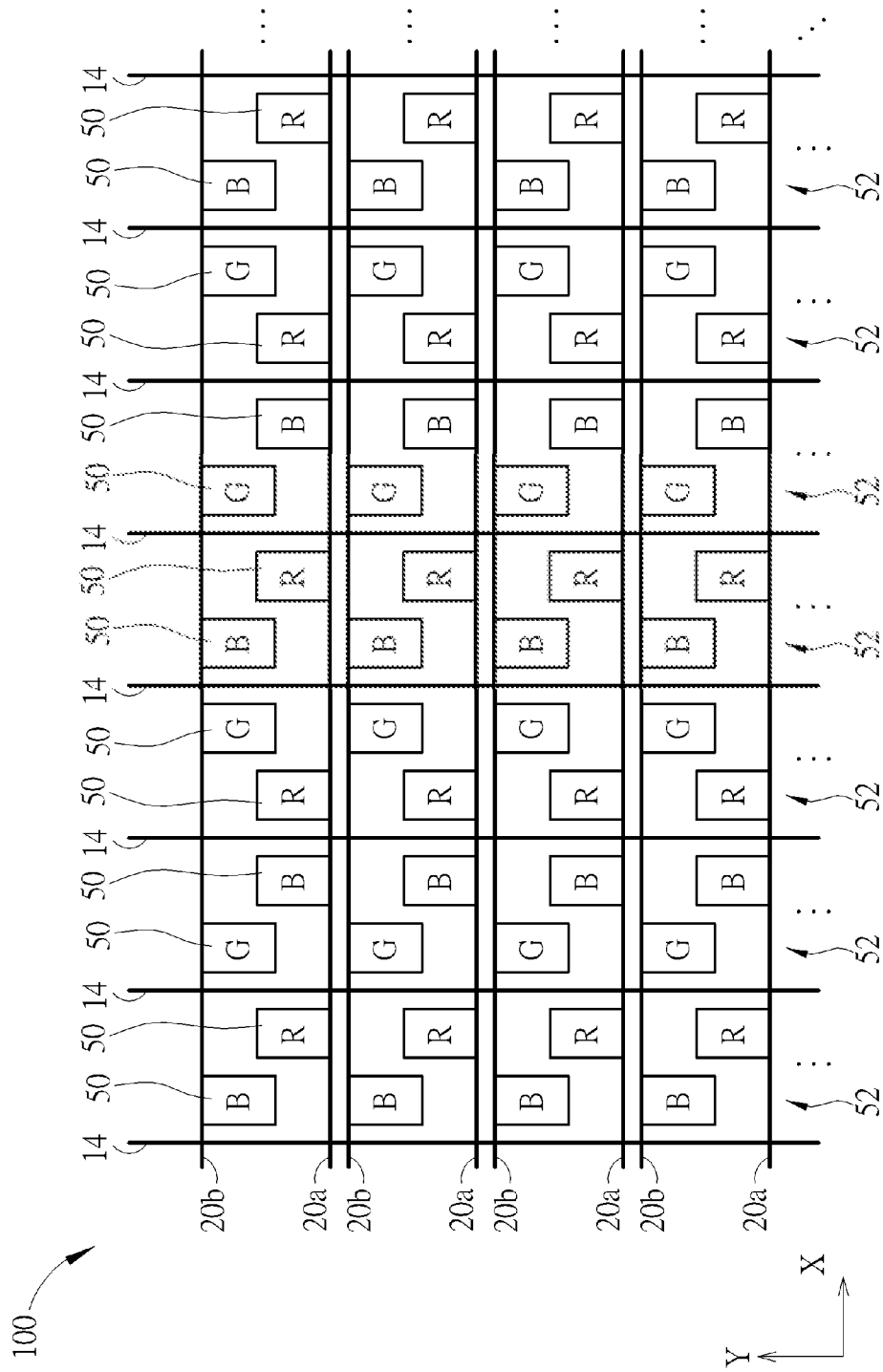
FIG. 8 is a configuration diagram of sub-pixels when the display in FIG. 1 is a color display.

In an embodiment of the present disclosure, the display 100 is a monochrome display, and in another embodiment of the present disclosure, the display 100 may be a color display. Please refer to FIG. 8. FIG. 8 is a configuration diagram of sub-pixels 50 when the display 100 in FIG. 1 is a color display. In this embodiment, the multiple sub-pixels 50 of the display 100 may comprise multiple first color sub-pixels R, multiple second color sub-pixels G, and multiple third color sub-pixels B. The first color sub-pixels R may be red sub-pixels, the second color sub-pixels G may be green sub-pixels, and the third color sub-pixels B may be blue sub-pixels, but the present disclosure is not limited thereto. In this embodiment, the first color sub-pixels R are coupled to the gate line 20a, and the second color sub-pixels G are coupled to the gate line 20b. In addition, the third color sub-pixels B are arranged to be a plurality of third color sub-pixel columns 52, wherein third color sub-pixels B in the $N^{th}$ third color sub-pixel column 52 are coupled to gate lines 20a, while third color sub-pixels B in the $(N-1)^{th}$ and the $(N+1)^{th}$ third color sub-pixel column 52 are coupled to gate lines 20b, and N is a positive integer greater than 1. In other words, if third color sub-pixels B in a third color sub-pixel column 52 are coupled to gate lines 20a, the third color sub-pixels B adjacent to the third color sub-pixel column 52 are coupled to gate lines 20b; in contrast, if third color sub-pixels B in a third color sub-pixel column 52 are coupled to gate lines 20b, the third color sub-pixels B adjacent to the third color sub-pixel column 52 are coupled to gate lines 20a. However, the present disclosure is not limited to the color arrangements, and any half source driving display pixel design in which the wiring length of the conductor 16 of each transistor is less than the width W of a pixel electrode falls in the scope of the present disclosure.

Figure 9:
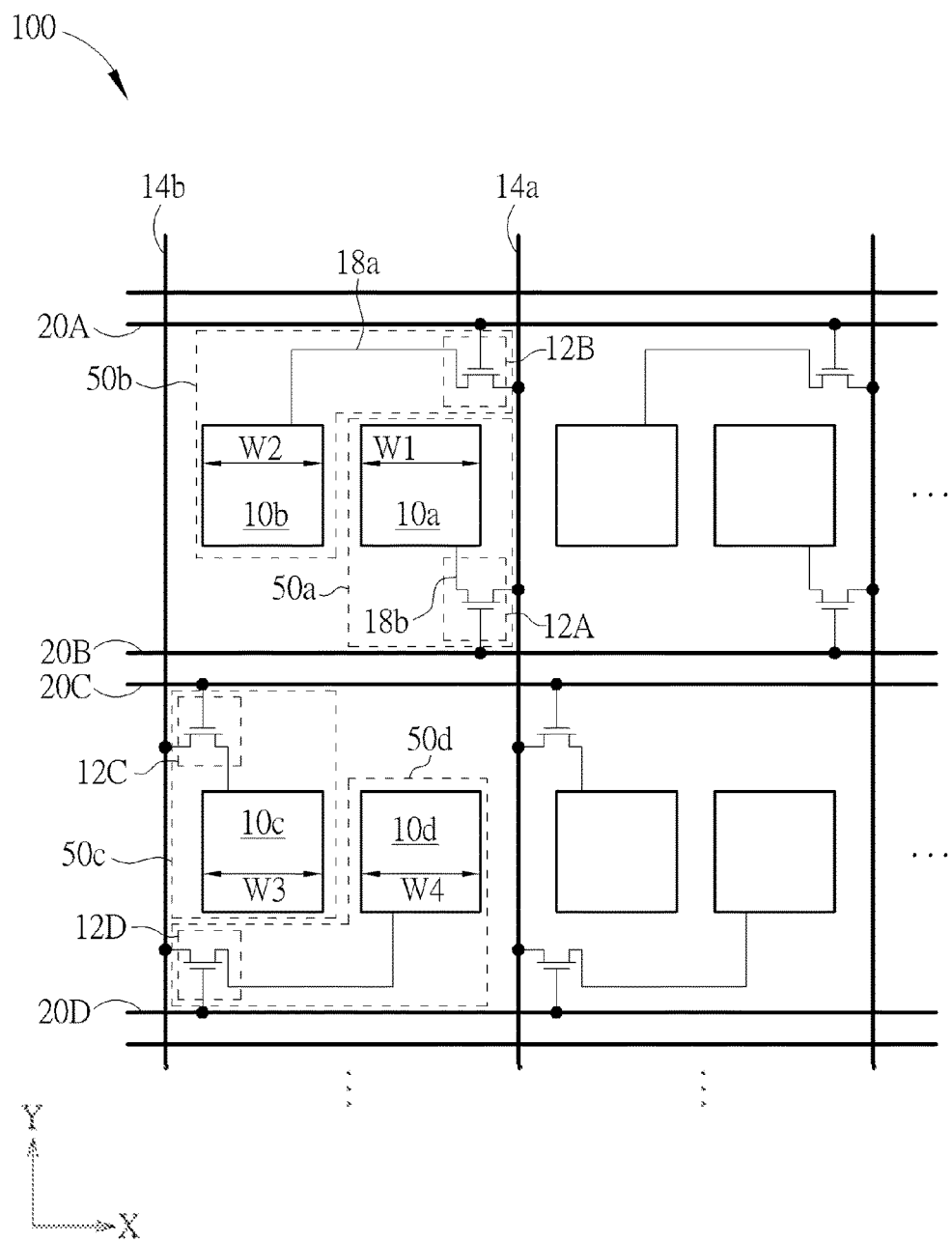
FIG. 9 is a schematic diagram of an equivalent circuit of the display in FIG. 1.

Please refer to FIG. 9. FIG. 9 is also a circuit diagram of the display 100 in FIG. 1. The display 100 comprises multiple sub-pixels 50, a plurality of data lines 14, and a plurality of gate lines 20. Each sub-pixel 50 comprises a pixel electrode 10, wherein the sub-pixels 50 comprise sub-pixels 50a and sub-pixels 50b. The sub-pixels 50a are disposed between the sub-pixels 50b and the data lines 14, and each comprises a transistor 12A and a pixel electrode 10. A first end of the transistor 12A is connected to the data line 14, and a second end of the transistor 12A is connected to the pixel electrode 10. In this embodiment, the first end and second end of the transistor 12A described above are a drain and a source of the transistor 12A, respectively. However, the present disclosure is not limited thereto. In another embodiment of the present disclosure, the first end and the second end of the transistor 12A described above may be a source and a drain of the transistor 12A, respectively. Electrodes of the sub-pixel 50a and the sub-pixel 50b have a width W1 and a width W2, respectively, wherein the width W1 is generally equal to the width W2. The distance between the first end of the transistor 12A and the data line 14 is less than the width W1, the distance between a first end of a transistor 12B and the data line 14 is also less than the width W1, and the distance between a second end of the transistor 12B and the pixel electrode 10 is greater than the width W2. A sub-pixel 50b comprises a transistor 12B and a pixel electrode 10. A first end of the transistor 12B is connected to the data line 14, and a second end of the transistor 12B is electrically connected to the pixel electrode 10. The gate line 20A and the gate line 20B are disposed on two sides of the transistor 12A and the transistor 12B, the transistor 12A is connected to the gate line 20B, and the transistor 12B is connected to the gate line 20A. In this embodiment, the first end and second end of the transistor 12B described above are a drain and a source of the transistor 12B, respectively. However, the present disclosure is not limited thereto. In another embodiment of the present disclosure, the first end and second end of the transistor 12B described above may be a source and a drain of the transistor 12B, respectively.

The sub-pixel structure of the display 100 may further comprise a data line 14b, a sub-pixel 50c, and a sub-pixel 50d. The sub-pixels 50a and 50b are disposed between the data lines 14a and the data lines 14b, and the sub-pixels 50c are disposed between the sub-pixels 50d and the data lines 14b. The sub-pixels 50c are disposed between the data lines 14a and the data lines 14b, and comprise a transistor 12C and a pixel electrode 10c. A first end of the transistor 12C is connected to the data line 14b, and a second end of the transistor 12C is connected to the pixel electrode 10c. In this embodiment, the first end and second end of the transistor 12C described above are a drain and a source of the transistor 12C, respectively. However, the present disclosure is not limited thereto. In another embodiment of the present disclosure, the first end and second end of the transistor 12C described above may be a source and a drain of the transistor 12C, respectively. Pixel electrodes 10c and 10d have a width W3 and a width W4, respectively; the distance between the first end of the transistor 12C and the data line 14b is less than the width W3, the distance between the second end of the transistor 12C and the pixel electrode 10c is also less than the width W3, the distance between a first end of a transistor 12D and the data line 14b is also less than the width W3, and the distance between a second end of the transistor 12D and the pixel electrode 10d is greater than the width W4. The sub-pixels 50d are disposed between the data lines 14a and the data lines 14b, and comprise a transistor 12D and a pixel electrode 10d. A first end of the transistor 12D is connected to the data line 14b, and a second end of the transistor 12D is connected to the pixel electrode 10c. The widths W1, W2, W3, and W4 are generally equal. In this embodiment, the first end and second end of the transistor 12D described above are a drain and a source of the transistor 12D, respectively. However, the present disclosure is not limited thereto. In another embodiment of the present disclosure, the first end and second end of the transistor 12D described above may be a source and a drain of the transistor 12D, respectively.

The pixel structure of the foregoing display 100 may further comprise gate lines 20A, 20B, 20C, and 20D. The gate line 20B and the gate line 20C are adjacent to each other, the sub-pixel 50a and the sub-pixel 50b are disposed between the gate line 20A and the gate line 20B, and the sub-pixel 50c and the sub-pixel 50d are disposed between the gate line 20C and the gate line 20D. Each of the transistors 12A, 12B, 12C, and 12D further comprises a gate, and the gates of the transistors 12A, 12B, 12C, and 12D are connected to the gate lines 20B, 20A, 20C, and 20D, respectively. Please refer to FIG. 9. In addition, the second end of the transistor 12A is coupled to the pixel electrode 10a through the conductor 18b, and the second end of the transistor 12B is coupled to the pixel electrode 10b through the conductor 18a.

In conclusion, in the display and pixel structure thereof of the present disclosure, by stipulating a wiring length of a first end of a sub-pixel transistor to be less than a width of a pixel electrode and designing the first ends of the sub-pixel transistors to have different wiring lengths, the equivalent load between the data lines and the transistors is not excessively large, thereby avoiding problems such as an insufficient driving capability of a source driver caused by excessive resistance-capacitance load in the prior art, and preventing the so-called "half-frame" phenomenon from occurring on the display.

The above description only provides preferred embodiments of the present disclosure, and all equivalent changes and modifications made according to the claims of the present disclosure falls within the scope of the present disclosure.

What is claimed is:

1. A pixel structure, comprising:
    a first data line;
    a first sub-pixel, comprising a first transistor and a first pixel electrode, wherein the first transistor has a first end and a second end, the first end is connected to the first data line, the second end is connected to the first pixel electrode, the first pixel electrode has a first width, and a distance between the first end and the first data line is less than the first width; and
    a second sub-pixel, comprising a second transistor and a second pixel electrode, wherein the second transistor has a first end and a second end, the first end of the second transistor is connected to the first data line, the second end of the second transistor is electrically connected to the second pixel electrode, the second pixel electrode has a second width, the first sub-pixel is disposed between the second sub-pixel and the first data line along a direction perpendicular to the first data line, and a distance between the first end of the second transistor and the first data line is less than the first width,
    wherein the first pixel electrode and the second pixel electrode are both coupled to the first data line; and
    wherein the pixel structure further comprises a first gate line and a second gate line adjacent to the first gate line, and the first pixel electrode and the second pixel electrode are coupled to the first gate line and the second gate line, respectively.

2. The pixel structure according to claim 1, wherein a distance between the second end of the first transistor and the first pixel electrode is less than the first width.

3. The pixel structure according to claim 1, wherein the pixel structure further comprises:
    a second data line, wherein the first sub-pixel and the second sub-pixel are disposed between the first data line and the second data line;
    a third sub-pixel, disposed between the first data line and the second data line, and comprising a third transistor and a third pixel electrode, wherein the third transistor has a first end and a second end, the first end of the third transistor is connected to the second data line, the second end of the third transistor is connected to the third pixel electrode, the third pixel electrode has a third width, and a distance between the first end of the third transistor and the second data line is less than the third width; and
    a fourth sub-pixel, disposed between the first data line and the second data line, and comprising a fourth transistor and a fourth pixel electrode, wherein the fourth transistor has a first end and a second end, the first end of the fourth transistor is connected to the second data line, the second end of the fourth transistor is electrically connected to the fourth pixel electrode, the fourth pixel electrode has a fourth width, wherein the third sub-pixel is disposed between the fourth sub-pixel and the second data line along a direction perpendicular to the first data line, and a distance between the first end of the fourth transistor and the second data line is less than the third width.

4. The pixel structure according to claim 3, wherein the first width, the second width, and the third width are equal or substantially equal to the fourth width.

5. The pixel structure according to claim 4, wherein a distance between the second end of the third transistor and the third pixel electrode is less than the third width.

6. The pixel structure according to claim 4, wherein the pixel structure further comprises a third gate line and a fourth gate line, wherein the first gate line is adjacent to the third gate line, the first sub-pixel and the second sub-pixel are disposed between the first gate line and the second gate line, and the third sub-pixel and the fourth sub-pixel are disposed between the third gate line and the fourth gate line;
wherein each of the first transistor, the second transistor, the third transistor, and the fourth transistor further comprises a control end, and the control ends of the first transistor, the second transistor, the third transistor, and the fourth transistor are coupled to the first gate line, the second gate line, the third gate line, and the fourth gate line respectively.

7. The pixel structure according to claim 1, wherein each of the first transistor and the second transistor further comprises a control end, the control end of the first transistor is coupled to the first gate line, the control end of the second transistor is coupled to the second gate line, the second end of the first transistor is coupled to the first pixel electrode through a first conductor, the second end of the second transistor is coupled to the second pixel electrode through a second conductor, the first gate line and the second gate line are formed at a first metal layer, the first conductor and the second conductor are formed at a second metal layer, an overlapping area between the first conductor and the second gate line is M times bigger than an overlapping area between the second conductor and the first gate line, and $2 \leq M \leq 4$.

8. The pixel structure according to claim 1, wherein the second end of the first transistor has a first total length, and the second end of the second transistor has a second total length different from the first total length.

9. The pixel structure according to claim 1, wherein the first pixel electrode and the second pixel electrode are orientated such that the first pixel electrode and the second pixel electrode are disposed along a direction of the first gate line.

10. A display, comprising:
a first sub-pixel, comprising:
a first pixel electrode, formed on a substrate, and having a first width along a first direction; and
a first transistor, configured to drive the first pixel electrode, wherein the first transistor comprises a first end, a second end, and a control end;
a first gate line, disposed along the first direction, and coupled to the control end of the first transistor;
a data line, disposed along a second direction, wherein the second direction is not parallel to the first direction, the first end of the first transistor comprises a first conductor coupled to the data line, the first conductor has a first wiring length along the first direction, the first wiring length of the first conductor is not greater than the first width of the first pixel electrode, and the second end of the first transistor comprises a second conductor, configured to be connected to the first pixel electrode;
a second sub-pixel, wherein the second sub-pixel comprises:
a second pixel electrode, formed on the substrate, and has a second width along the first direction; and
a second transistor, configured to drive the second pixel electrode, wherein the second transistor comprises a first end, a second end, and a gate; and
a second gate line, disposed along the first direction and coupled to the control end of the second transistor, wherein the first gate line is different from the second gate line, the first end of the second transistor comprises a third conductor coupled to the data line, the third conductor has a second wiring length along the first direction, the second wiring length of the third conductor is not greater than the second width of the second pixel electrode, and the second end of the second transistor comprises a fourth conductor, configured to be connected to the second pixel electrode,
wherein the first pixel electrode and the second pixel electrode are both coupled to the data line; and
wherein the first pixel electrode and the second pixel electrode are coupled to the first gate line and the second gate line, respectively.

11. The display according to claim 10, wherein the first pixel electrode is disposed between the data line and the second pixel electrode.

12. The display according to claim 11, wherein a wiring length of the second conductor of the second end of the first transistor is not greater than the first width of the first pixel electrode; and
a wiring length of the fourth conductor of the second end of the second transistor is greater than the first width of the first pixel electrode.

13. The display according to claim 12, wherein the first gate line and the second gate line are formed at a first metal layer, and the first conductor, the second conductor, the third conductor, and the fourth conductor are formed at a second metal layer;
wherein an overlapping area between the second conductor and the first gate line is M times bigger than an overlapping area between the fourth conductor and the second gate line, wherein $2 \leq M \leq 4$.

14. The display according to claim 10, wherein the first sub-pixel and the second sub-pixel are disposed between the first gate line and the second gate line.

15. The display according to claim 10, wherein the first gate line and the second gate line are disposed between the first sub-pixel and the second sub-pixel, and the first gate line is disposed parallelly to the second gate line.

16. The display according to claim 15, wherein the first gate line has an U-shaped structure, and the second gate line has another U-shaped structure, wherein each of the U shaped structures has an opening, the opening of the U-shaped structure of the first gate line faces towards the first sub-pixel, and the opening of the U-shaped structure of the second gate line faces towards the second sub-pixel.

17. The display according to claim 10, wherein the second end of the first transistor has a first total length, and the second end of the second transistor has a second total length different from the first total length.

18. The display according to claim 10, wherein the first pixel electrode and the second pixel electrode are orientated such that the first pixel electrode and the second pixel electrode are disposed along a direction of the first gate line.

* * * * *